United States Patent [19]
Ting et al.

[11] Patent Number: 5,671,189
[45] Date of Patent: Sep. 23, 1997

[54] LOW STANDBY POWER REDUNDANCY CIRCUIT

[75] Inventors: Tah-Kang Joseph Ting, Hsinchu; Bor-Doou Rong, Chupei; Jun-Wei Luo, Chutung Hsinchu, all of Taiwan

[73] Assignee: Etron Technology, Inc., Hsin-Chu, Taiwan

[21] Appl. No.: 654,519

[22] Filed: May 28, 1996

[51] Int. Cl.$^6$ ........................................... G11C 7/00
[52] U.S. Cl. .................. 365/229; 365/225.7; 365/201; 365/189.06; 365/189.08
[58] Field of Search ................. 365/225.7, 229, 365/195, 201, 189.06, 189.08

[56] References Cited

U.S. PATENT DOCUMENTS

| | | | |
|---|---|---|---|
| 4,601,019 | 7/1986 | Shah et al. | 365/200 |
| 4,621,346 | 11/1986 | McAdams | 365/227 |
| 4,996,670 | 2/1991 | Ciraula et al. | 365/200 |
| 5,262,994 | 11/1993 | McClure et al. | 365/200 |
| 5,519,658 | 5/1996 | Uda et al. | 365/200 |
| 5,563,546 | 10/1996 | Tsukada et al. | 365/229 |

*Primary Examiner*—Tan T. Nguyen
*Attorney, Agent, or Firm*—George O. Saile; Stephen B. Ackerman

[57] ABSTRACT

A low power redundancy circuit that has applications in CMOS memories. This circuit employs fuses to select addressing paths and to provide address information of failing memory columns. Path selection is made by rendering a fuse device non-conductive which disconnects a clamping off bias that inhibits conduction through an N-channel transistor and preventing signal flow through the selected addressing paths to the output. Memory column addressing information is generated by selectively rendering a second set of fuses conductive or non-conductive to produce a logical one or zero respectively at the output of the addressing paths. A redundant signal is used to precondition the select circuitry and prevent a transient pulse from propagating through the output of the select circuitry when a section is not activated. The circuit uses CMOS N-channel transistors configured such as to produce low standby power while being able to deliver necessary output signals when path selection is made. Portions of the redundant circuit paths are shared with other paths to further minimize the use of power.

14 Claims, 2 Drawing Sheets

LOW STANDBY POWER REDUNDANCY CIRCUIT

BACKGROUND OF THE INVENTION

1. Field of Invention

This invention relates to the need to repair VLSI devices to enhance product yield and in particular CMOS memories, Although, this particular invention is not necessarily limited to semiconductor memories, it is most useful in areas of replication of circuitry in which faults can be disconnected and the faulty circuitry or paths replaced with a spare.

2. Description of Related Art

As with other inventions using fuses, in this invention fuses are used to repair and activate redundant paths. There are several methods that have been used from storing addresses of faulty locations to using a fuse to enable a repairing circuit. The fuses are usually polysilicon conducting devices that can be rendered non-conductive by a laser, and in doing so selecting a particular set of circuitry or providing information about the location of failing elements. In the array section of semiconductor memory devices fuses have been used to store the addresses of the failing array columns so that these columns can be replaced by redundant columns on the same chip. When fuses are used in active circuitry, they lie between the power rails of the circuitry. Thus providing the opportunity to increase power consumption. It is advantageous when using fuses to create a surrounding circuit environment that has an extremely low standby current drain so as not to appreciably affect the power dissipation of the semiconductor device. Some techniques that have been used limited the current through the fuses by placing them in series with a resistive device or pulsing the circuitry with a low duty cycle. In both of these cases the current involved is too high for today's devices. Another approach is to use feedback circuitry to maintain the bias of the transistors connected to the fuses between the power rails at or near an off state during standby. Whereas, this technique as described in U.S. Pat. No. 4,621,346 by Hugh P. McAdams can satisfy the requirement of low current drain and power dissipation, it can place some restrictions on the surrounding circuit configuration and may not be applicable in all instances.

It is the purpose of this invention to provide circuit redundancy from which to improve yield of semiconductor devices while maintaining low standby power consumption through the use of fused circuits designed to provide low standby power dissipation, and through the use of shared signal paths to minimize power consumption in the redundant design. It is also the purpose of this invention to provide low standby power dissipation while at the same time providing transient pulse free signals.

SUMMARY OF THE INVENTION

This invention both selects the redundant signal path and provides the address information for location of a faulty memory cell to be disconnected from the signal flow. In the first part of the invention is a select circuit in which a fuse device is connected between the bias node of the gate of the lower of a two CMOS transistor stack and a bias clamping circuit. The select circuit output is taken from the upper transistor in the two transistor stack which forms a logical "nand" circuit having two inputs. One input being connected to the bias clamping circuit and the other to a section select signal. The clamp circuit which performs a logical "nor" function has as its inputs the memory RAS signal and the section select signal which is same signal that drives the upper transistor in the stack. When both the RAS and select signal are low the clamp is off, and the upper stack transistor is off, no signal is output. In this standby state there is only leakage current flowing and there is no appreciable power dissipation. The RAS signal is used to precondition the clamp to be on and the lower stack transistor to be off prior to the select signal. This is done to prevent a transient pulse from occurring at the select circuit output as a result of the delay differences between the upper stack transistor turning on and the combination of the clamp transistor turning on and the lower stack transistor turning off.

When the fuse is rendered non-conductive, the clamp is removed and the lower stack transistor is biased on by a bias transistor connected to Vcc. This allows a signal from output of the select circuit when a select signal is applied to the upper of the two stack transistors. The output signal from the select circuit selects by activation which set of addressing paths is to be used. Each set of addressing paths are connected to a similar select circuit outputs and contain address information for different failing memory columns. The address information is determined by whether a second set of fuses are conductive or non-conductive. When the second set of fuses are conductive, the output from the select circuit is connected through to the output to the addressing paths and providing a logical one for each bit in the column address. When the set of fuses are selectively rendered non-conductive, the output of the particular addressing paths is disconnected from the select circuit output, producing a logical zero at the address path output. When a set of address paths is not selected, there is no select signal and the output of the set of address paths is a logical zero for each individual address path regardless of the conductive state of the fuses. The latter stages of the addressing paths can be shared between two different sets of paths since only one section can be selected and active at the same time.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
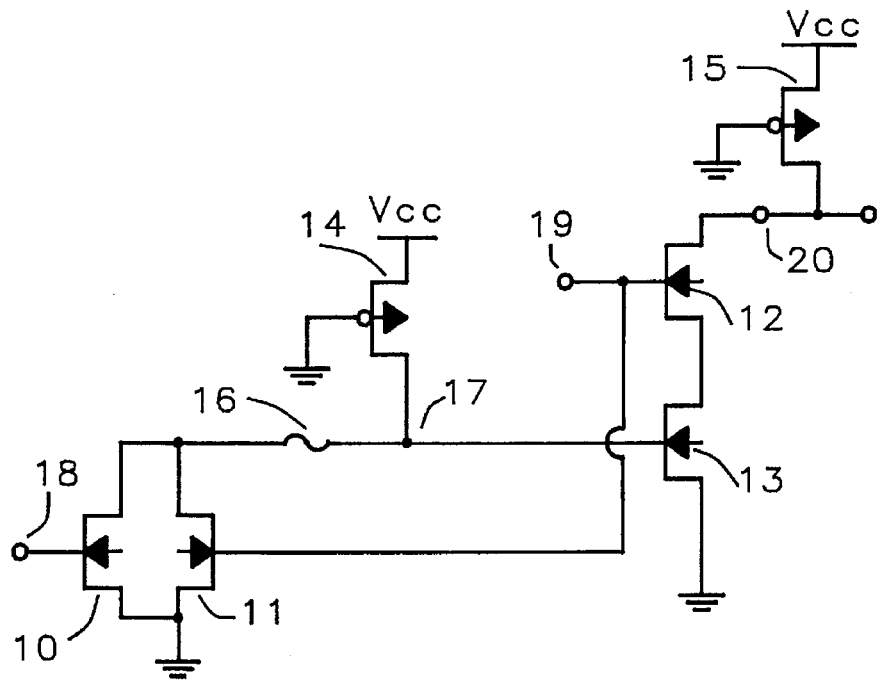
FIG. 1 is an electrical circuit diagram of the CMOS fused selector circuit according to the invention.

Referring to FIG. 1, a fused selector circuit is shown in accordance with the invention. Fuse element 16 is connected between node 17 and N-channel clamping transistors 10 and 11. Node 17 is the bias node for the input to N-channel transistor 13 which is the lower transistor in a two transistor stack. Node 17 is biased by the connection of the P-channel transistor 14 between node 17 and Vcc. Clamp input 18 is a system signal called RAS and input 19 is the select signal that connects to one of the clamp inputs and to the input to the upper stack N-channel transistor 12. The output 20 of the selector circuit is connected to transistor 12 and a biasing P-channel transistor 15 which in turn is connected to Vcc. Transistor 15 is shown to complete the voltage conditioning of FIG. 1, and represents several biasing transistors that can be connected to output 20. These are shown in FIG. 4 as P-channel transistors 48, 49, 50 and 51.

Figure 2:
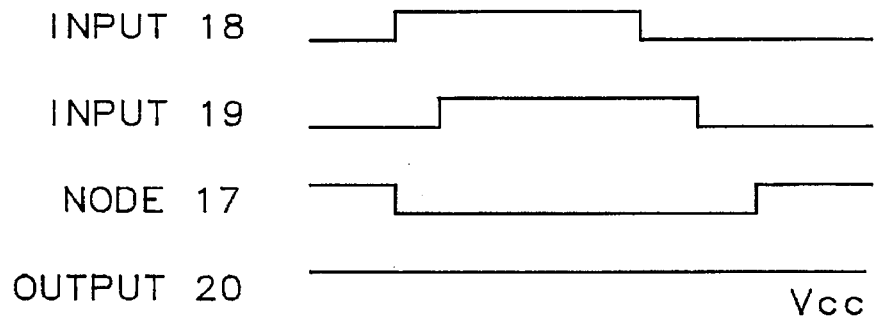
FIG. 2 is the voltages at key points of the selector circuit of the invention when the circuit is being selected but the fuse is conductive.

Continuing to refer to FIG. 1 along with the signal wave forms of FIG. 2, at standby when RAS input 18 and section select input 19 are low, transistors 10, 11 and 12 are off. If the fuse 16 is conductive, section not activated, node 17 is high and transistor 13 is on, but output 20 is high because transistor 12 is off. All currents flowing in the circuit are leakage currents satisfying the criteria for the circuit. When RAS input 18 goes high, node 17 goes low, transistor 13 is off and output 20 remains high because both transistors 12 and 13 are off. If section select input 19 goes high after RAS input 18 is already high, transistor 12 is on but output 20 remains high since node 17 is low and transistor 13 is off. If the RAS input 18 did not exist or remained low when section select 19 went high, a transient pulse could appear at output 20 caused by the difference in the turn on of transistor 12 and the combination of the turn on of transistor 11 and the turn off of transistor 13.

Figure 3:
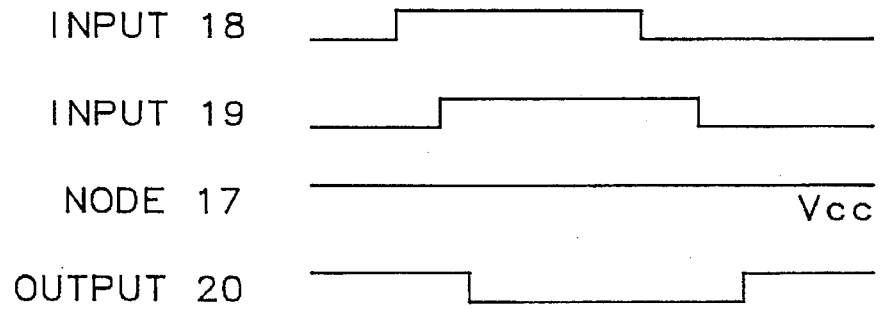
FIG. 3 is the voltages at key points of the selector circuit of the invention when the fuse is non-conductive and the circuit is selected; and, FIG. 4 is an electrical circuit of the invention of the addressing paths that are driven by the selector circuits.

Looking at FIG. 3 in conjunction with FIG. 1, when fuse 16 is made non-conductive, the section is activated and transistors 10 an 11 are disconnected from node 17. The voltage on node 17 goes to Vcc as provided by the bias transistor 14. Transistor 13 is on, and when the select signal 19 changes from a low to high voltage, output 20 goes from a high voltage to a low voltage. This selects the paths connected to output 20.

Figure 4:
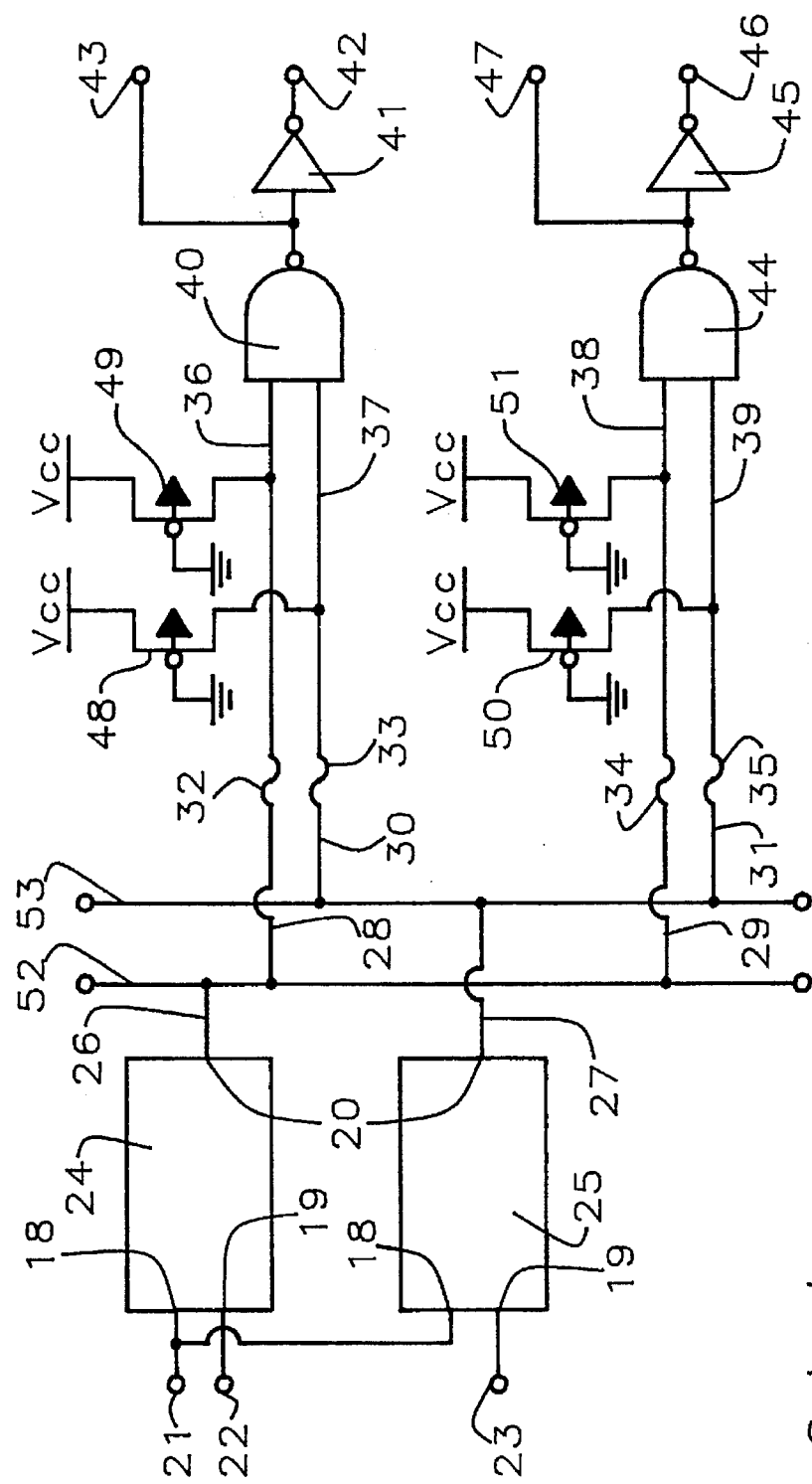

In FIG. 4 is shown two select circuits 24 and 25 as describe by FIG. 1, each having input nodes 18 and 19, and output node 20 as shown within the block diagrams. Signals are connected to these select circuits through RAS signal input 21, section select 0 signal input 22 and section select 1 signal input 23. The output nodes 20 are connected through output lines 26 and 27 to output signal lines 52 and 53 respectively. Also connected to these signal lines are the section addressing paths of the remaining circuitry. Shown in FIG. 4 are two sets of addressing paths of the several that can be connected to the output signal lines 52 and 53. Each of these paths contain a fuse device similar to 32, 33, 34 and 35. Each fuse when rendered conductive or non-conductive provides the value of a bit in address of the defective memory column. The paths share output circuitry since the two sections cannot be active at the same time. As such, circuit 40 has as an input nodes 36 and 37. Node 36 is connected to select circuit 24 through fuse 32, signal line 28, signal line 52 and output line 26. Node 37 is connected to select circuit 25 through fuse 33, signal line 30, signal line 53 and output line 27. In like manner nodes 38 and 39 are connected to select circuits 24 and 25 respectively. Each common circuit path represented by circuit elements 40, 41, 42 and 43, or circuit elements 44, 45, 46 and 47, are connected to the two select circuits 24 and 25 through separate paths. This sharing of common circuit elements can be accomplished because only one of the two paths connected to the input of elements 40, 44, and the likes, is active at a time. Although, this particular invention shows only 2 paths connected to the input of each common circuit element, this is not a necessary limit of the invention. The bias for the network 28, 32, and 36 is provided by the connection of the P-channel bias transistor 49 connected between node 36 and Vcc. In like manner each of the inputs to the common circuit elements represented by 40 and 44 are connected to a bias transistor. Fuse 32, when conductive, is used to connect the node 36 to signal output 26 of the select circuit 24. The presence of the select signal at node 36 represents a logical "1" in a bit of the address of the failing memory column. The absence of the select signal at node 36 caused by rendering the fuse non-conductive represents a logical "0" in a bit of the address of the failing memory column. In like manner, the other fuses 33, 34 and 35 are used to provide addressing information for each section. Fuses 32 and 34 forming a part of the address for section 0 and fuses 33 and 35 a part of the address for section 1. In similar manner additional addressing networks represented by the interconnection 28, 32, 36, 40, 41 and 42 and the interconnection of 30, 33, 37, 40, 41 and 42 are connected to signal lines 52 and 53 for each bit in the memory column address.

While the invention has been particularly shown and described with reference to preferred embodiments thereof, it will be understood by those skilled in the art that various changes in form and details may be made without departing from the spirit and scope of the invention.

What is claimed is:

1. A low standby power redundancy circuit for CMOS memories comprising:
   (a) a plurality of circuit paths arranged in parallel and having at least two sections of paths,
   (b) each section of paths consisting of multiple addressing paths connected to an output of a select circuit,
   (c) each section of paths maintained in low standby power state when not activated or selected,
   (d) said select circuit being activated by rendering a first fuse device in said select circuit non-conductive,
   (e) signal means to select each section when fuse device is rendered non-conductive and producing a signal at select circuit output,
   (f) said select circuit output connected to a set of multiple addressing paths,
   (g) each addressing path containing a second fuse device connected in series with the output of the select circuit,
   (h) said second fuse device when rendered conductive or non-conductive providing the value of a bit in the address of a failing memory location.

2. The circuit of claim 1 wherein said select circuit maintains circuitry in low standby power state comprising:
   (a) an output transistor connected between a gating transistor to circuit ground and one or more biasing transistors to Vcc,
   (b) the input to said gating transistor connected to a bias transistor to Vcc and through a fuse device to a two transistor clamping circuit,
   (c) the signal input to the output transistor and the first clamp transistors being a select signal,
   (d) the second clamp transistor input being a memory RAS signal,
   (e) the RAS and select signals in standby being in low voltage state and holding off the two clamp transistors and the select circuit output transistor,
   (f) the gating transistor being biased on by the bias transistor connected to the gating transistor input,
   (g) said output transistor being off and connected in series with said gating transistor preventing other than leakage current to flow through the gating transistor.

3. Multiple addressing paths of claim 1 wherein address paths for different addresses share same address path output circuitry to conserve on power as a result of only one repair address used at a time.

4. The address of the failing memory location of claim 1 comprising:

(a) a logical one or a logical zero, (b) said logical one caused by the propagation of an output signal of the select circuit through to the output of the address path, (c) said logical zero caused by disconnecting the select circuit output signal from the address path by rendering a fuse device non-conductive and causing the signal output of the address path to be a result of Vcc connected through a bias transistor.

5. The address of the failing memory location of claim 4 wherein the select circuit output signal causes a logical zero at the address path output and the absence of the select circuit output signal causes a logical one at the address path output.

6. A select circuit having circuit means to provide low standby power and an output free of transient pulses and comprising:

(a) an output transistor connected in series with a gating transistor, (b) said gating transistor connected to circuit ground and the output transistor connected to Vcc through one or more bias transistors, (c) the input to said output transistor being a section select signal, (d) the input to said gating transistor being connected to two clamping transistors through a fuse device and to Vcc through a bias transistor, (e) each of said two clamping transistors further connected to circuit ground and one being controlled on or off by said section select signal and the other by a memory RAS signal, (f) said RAS signal preceding the section select signal, clamping off said gating transistor and preventing an error signal in the form of a transient pulse at the output of the select circuitry when said fuse device is conductive maintaining the connection of the clamp on the output circuitry, (g) said section select signal maintaining the clamp signal on said gating transistor input until said section select signal is removed and output transistor is off, (h) said fuse device when rendered non-conductive disconnecting clamping transistors from the circuit, allowing said gating transistor to be on and in turn allowing said output transistor to respond to section select signal.

7. The select circuit of claim 6 being connected to the memory RAS signal with other select circuits, (a) each select circuit having different select signals inputs, (b) each select circuit output driving a different set of address paths.

8. The circuit of claim 6 wherein said circuit means to provide an output free of transient pulses comprising:

(a) two clamp transistors connected in parallel between circuit ground and the input of the output gating transistor through a conductive fuse device, (b) the output gating transistor connected between ground and the select circuit output transistor, (c) a select signal connected to the output transistor and the first input of the clamp transistors, (d) whereby when the select signal initially at low voltage holding said clamp transistor and said output transistor off with the gating transistor connected to the output transistor biased on, (e) whereby when the select signal going high, turning on said clamp transistor and said output transistor, and turning off said gating transistor as a result of said clamp transistor turning on, (f) the mismatch in delay between said output transistor turning on and the combination of said clamp transistor turning on and said gating transistor turning off producing the possibility of a transient pulse at the output, (g) said transient pulse avoided by applying the memory RAS signal to the input to the second clamp transistor prior to the select signal and turning off the gating transistor before the output transistor is turned on.

9. A low power redundancy circuit for memory purposes providing addressing information for replacement of failing memory location and comprising:

(a) multiple select circuits each containing a first fuse device and each connected to different sections of addressing circuitry, (b) said first fuse when rendered non-conductive activating the select circuit and allowing selection of said addressing circuitry, (c) said addressing circuitry consisting of multiple paths and each path of the addressing circuitry connected to an output of a select circuit, (d) a second fuse device in each address path connected in series between the output of the select circuit and the input to the addressing circuitry, (e) the connection between second fuse device and input to the addressing circuitry connected to Vcc through a bias transistor, (f) said bias transistor providing bias to output of select circuit through said second fuse device, (g) each said second fuse device when rendered conductive or non-conductive producing at the output of the paths of the addressing circuitry a signal with the value of a bit in the address of the failing memory location.

10. The circuit of claim 9 wherein said circuit for memory purposes providing addressing information for replacement of failing memory location and comprising:

(a) several similar addressing paths connected to a select circuit output and each providing a logical bit of the address of the failing memory location, (b) a fuse device in each addressing path connected in series between select circuit output and the junction between a bias transistor and an input to common circuitry shared with other addressing paths, (c) the output signal of the select circuit providing a logical one signal at the output of the addressing paths when the fuse device is conductive, (d) the fuse device when rendered non-conductive disconnecting the output of the select circuit from the addressing circuit and by absence of the select signal producing a logical zero at the output of the addressing paths.

11. The addressing path of claim 10 wherein the output of the select circuit signal produces a logical zero at the output of the addressing paths and the absence of the select circuit signal produces a logical one.

12. A clamp circuit controlling select circuit output off during and after a select signal transition comprising:

(a) first and second clamp transistors connected in parallel between circuit ground and the input to a gating transistor through a fuse device, (b) said gating transistor connected in series with an output transistor which in turn is connected to Vcc through a bias transistor at its output, (c) signal input to said first clamp transistor being a memory RAS signal, (d) signal input to said second clamp transistor and the output transistor being a select signal, (e) the select and RAS signals being initially in a low voltage state controlling the clamp transistors off and the output transistor off and allowing the gating transistor to be biased on, (f) the output of the output transistor being in a high voltage state, (g) whereby when the RAS signal goes from a low voltage state to a high voltage state prior to the select signal going to a high voltage state controlling the gating transistor off, (h) the output transistor turning on when the select signal goes to a high voltage, (i) the output of the output transistor remaining high as a result of the gating transistor being held off by the RAS signal.

13. A select circuit comprising:

(a) a transistor "nand" circuit with first input connected to the output of a transistor "nor" circuit and a bias transistor to Vcc, (b) the output of said "nand" circuit being the select circuit output, (c) said "nand" circuit and bias transistor separated from said "nor" circuit by a fuse device, (d) a select signal connected to the second input of said "nand" circuit and the first input of said "nor" circuit, (e) said "nor" circuit output controlling "nand" circuit off when select signal is present at the input of said "nor" circuit and fuse device in conductive, (f) a memory RAS signal applied to the second input of the "nor" circuit in advance of the select signal to prevent a transient pulse at the output of the select circuit, (g) the fuse device when rendered non-conductive disconnects the "nor" circuit output from the first input to the "nand" circuit and allowing said first input to the "nand" circuit to be biased on by the bias transistor, (h) a select signal applied to the second input of the said "nand" circuit when the fuse device is rendered non-conductive produces a signal at the output of said "nand" circuit.

14. A low standby power memory circuit for selecting addressing information to replace failing memory locations, and comprising:

(a) a low standby power select circuitry activated by rendering a first fuse device non-conductive, (b) said select circuit, when activated, selecting a section of addressing paths through signal means, (c) each addressing path having a second fuse device when conductive or non-conductive providing addressing information to replace failing memory locations, (d) each address path grouped with other address paths into sections and each section providing the address of a different failing memory location, (e) multiple sections of addressing paths, each activated and selected by a separate select circuit and sharing address path output circuitry with other sections, (f) each section of address paths mutually exclusive of other sections of address paths with only one section being selected at a time, (g) each section of addressing paths providing a different address for a different failing memory location.

* * * * *